United States Patent [19]

Fitzpatrick et al.

[11] Patent Number: 4,970,406
[45] Date of Patent: Nov. 13, 1990

[54] RESETTABLE LATCH CIRCUIT

[75] Inventors: Mark E. Fitzpatrick, San Jose; Gary R. Gouldsberry, Cupertino; Yat-Sum Chan; Richard F. Pang, both of San Jose, all of Calif.

[73] Assignee: Gazelle Microcircuits, Inc., Santa Clara, Calif.

[21] Appl. No.: 372,225

[22] Filed: Jun. 26, 1989

Related U.S. Application Data

[63] Continuation of Ser. No. 139,500, Dec. 30, 1987, abandoned.

[51] Int. Cl.$^5$ .................. A03K 3/286; A03K 3/289; A03K 3/29
[52] U.S. Cl. .................. 307/272.1; 307/279; 307/272.2; 307/291; 307/292; 307/272.3
[58] Field of Search .......... 307/291, 292, 272.1, 307/272.2, 279, 564, 567, 272.3

[56] References Cited

U.S. PATENT DOCUMENTS

| | | | |
|---|---|---|---|
| 3,241,017 | 3/1966 | Madsen et al. | 307/292 |
| 3,743,857 | 7/1973 | Fussell | 307/291 |
| 3,813,558 | 5/1974 | Krick et al. | 307/286 |
| 3,820,086 | 6/1974 | Ho et al. | 307/291 |

FOREIGN PATENT DOCUMENTS

| | | | |
|---|---|---|---|
| 0220015 | 9/1987 | Japan | 307/272.1 |
| 0249515 | 10/1987 | Japan | 307/272.1 |

OTHER PUBLICATIONS

Garner, "Transistor Topics", *Popular Electronics*, Jun. 1961, pp. 96–98.

Primary Examiner—Timothy P. Callahan
Attorney, Agent, or Firm—Skjerven, Morrill, MacPherson, Franklin & Friel

[57] ABSTRACT

A reset circuit incorporated into a latch circuit which comprising a follow portion and a hold portion and generates an output signal at an output terminal in response to an input data signal and a clock signal. A reset signal is applied, via a diode, to the output terminal which causes the output terminal to immediately assume the state of the reset signal without any intervening gate delay.

12 Claims, 7 Drawing Sheets

FIG. 1B
(PRIOR ART)

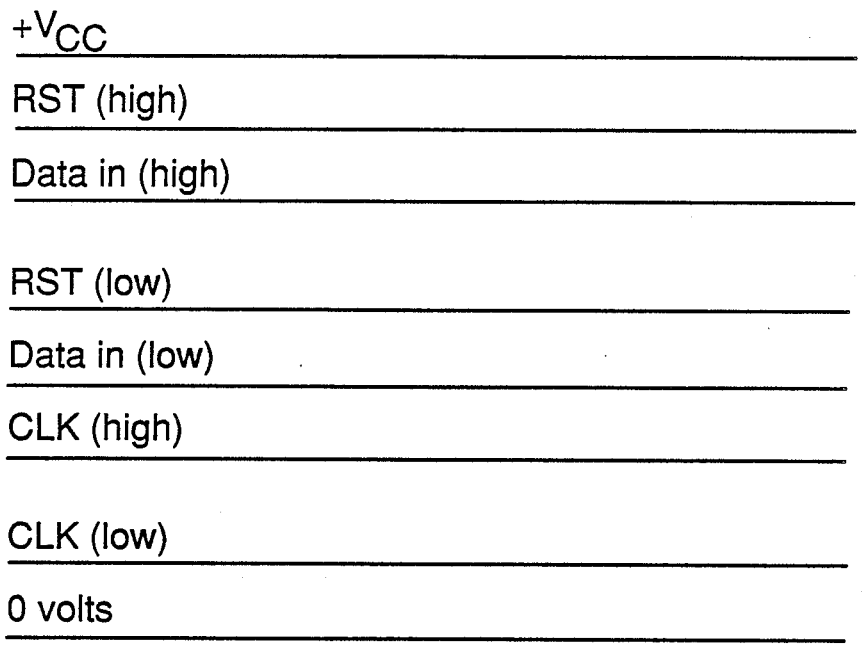

FIG. 2B
(PRIOR ART)

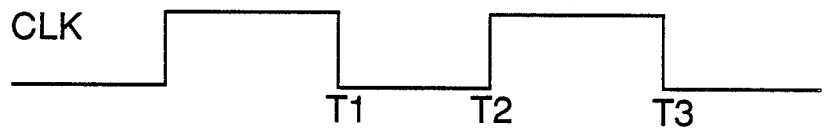

T1 - MASTER RECEIVES DATA$_{IN}$ AND PROVIDES CORRESPONDING DATA$_{OUT}$ AND $\overline{DATA}_{OUT}$.

T2 - MASTER HOLDS DATA$_{OUT}$ AND $\overline{DATA}_{OUT}$.

T2 - SLAVE RECEIVES DATA$_{OUT}$ AND $\overline{DATA}_{OUT}$.

T2 - OUTPUT STAGE PROVIDES DATA'$_{OUT}$ AND $\overline{DATA}'_{OUT}$.

T3 - SLAVE HOLDS DATA'$_{OUT}$ AND $\overline{DATA}'_{OUT}$.

T3 - MASTER RECEIVES NEXT DATA$_{IN}$ AND PROVIDES CORRESPONDING DATA$_{OUT}$ AND $\overline{DATA}_{OUT}$.

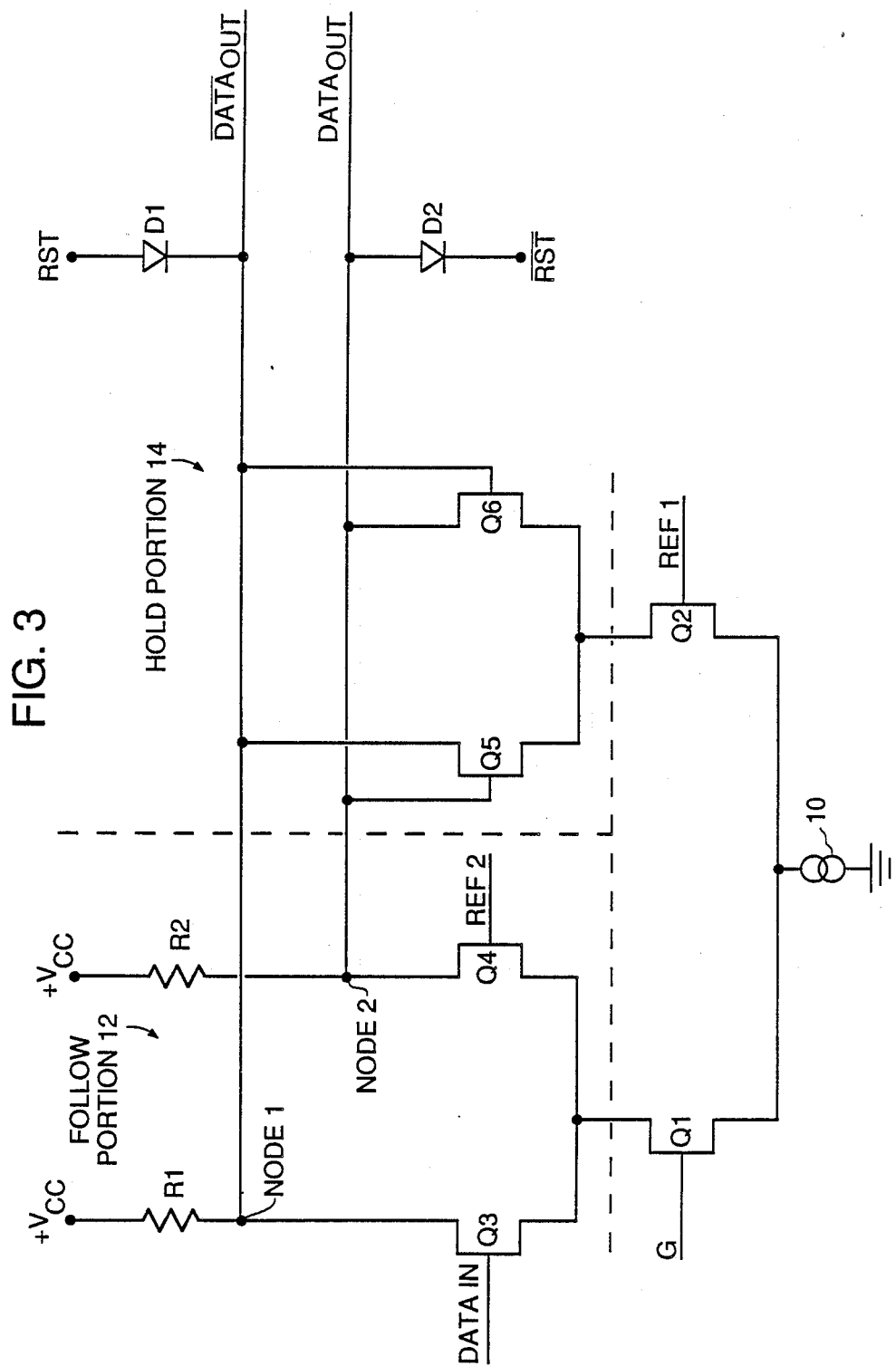

RESETTABLE LATCH CIRCUIT

This application is a continuation of application Ser. No. 139,500, filed Dec. 30, 1987, now abandoned.

FIELD OF THE INVENTION

This invention relates to latch circuits and in particular to an improved circuit for resetting a latch circuit.

BACKGROUND OF THE INVENTION

A typical and basic resettable latch circuit is shown in FIG. 1a and will be used to illustrate various drawbacks of prior art latch circuits incorporating a reset feature. Generally, the circuit of FIG. 1a is comprised of three portions: follow circuit 2, hold circuit 3, and output circuit 4. Follow circuit 2 receives data signals $Data_{in}$ and $\overline{Data}_{in}$. Upon enablement of follow circuit 2 by a high clock signal CLK, follow circuit 2 applies corresponding signals, to output circuit 4, which then generates the appropriate output signals, $Data_{out}$ and $\overline{Data}_{out}$. The function of hold circuit 3 is to maintain the state of $Data_{out}$ and $\overline{Data}_{out}$ while clock signal CLK is low, i.e., when $\overline{CLK}$ is high. Therefore, the states of $Data_{out}$ and $\overline{Data}_{out}$ will be fixed until the states of $Data_{in}$ and $\overline{Data}_{in}$ change and CLK goes high. The function of output circuit 4 is to level shift the signals generated by follow circuit 2 and hold circuit 3 in order to provide the desired level of $Data_{out}$ and $\overline{Data}_{out}$ to a subsequent stage.

A reset signal RST may be concurrently applied to follow circuit 2 and hold circuit 3 to reset $Data_{out}$ to a logical zero and $\overline{Data}_{out}$ to a logical one. The latch will be in its reset state until reset signal RST is removed and clock signal CLK is high. The drawback in the configuration of the resettable latch circuit of FIG. 1a, as will be seen in detail below, is that reset signal RST must have a high state level which is higher than the high state level of $Data_{in}$ in order for reset signal RST to override a high $Data_{in}$ signal. FIG. 1b shows a diagram of the required high and low voltage levels of clock signal CLK, $Data_{in}$, and reset signal RST between the range of zero volts and supply voltage $V_{cc}$. Since a larger $Data_{in}$ swing would make follow circuit 2 less affected by noise, it is advantageous to eliminate the need for the reset signal to use up a portion of the zero to $V_{cc}$ voltage range to allow the $Data_{in}$ signal to have a larger voltage swing. The circuit of FIG. 1a and another prior art latch circuit will now be described in detail so that the above-described drawback and other drawbacks of prior art resettable latch circuits will be made clear.

In FIG. 1a, constant current source 10 is coupled to the emitters of transistors Q1 and Q5 forming a differential pair. The configuration of this differential pair operates such that when clock signal CLK is high, all current supplied by current source 10 will flow through transistor Q1. The collector of transistor Q1 is coupled to a differential pair configuration comprising transistor Q2 and transistors Q3 and Q4 coupled in parallel, wherein data signal $Data_{in}$ is coupled to the base of transistor Q2, $\overline{Data}_{in}$ is coupled to the base of transistor Q3, and reset signal RST is coupled to the base of transistor Q4. Thus, when clock signal CLK is high and $Data_{in}$ is sufficiently high to turn on transistor Q2 and bias transistor Q1 in its active mode, current supplied by current source 10 flows through transistor Q2 and pulls down node 1 (the collector of transistor Q2) to a low level. Meanwhile, $\overline{Data}_{in}$, being at a low level, renders transistor Q3 nonconductive. When reset signal RST is low and node 1 is low, transistor Q10, whose base is coupled to node 1 and whose collector is coupled to $+V_{cc}$, will be in a low state. Since node 1 is low, the emitter of transistor Q10, which is coupled to the $\overline{Data}_{out}$ terminal and current source 14, is also low. Since transistors Q3 and Q4 are off, node 2 (the common collectors of transistors Q4 and Q3) will be high. Transistor Q9, whose base is coupled to node 2 and whose collector is coupled to $+V_{cc}$, will be in a high state, pulling up to a high level the $Data_{out}$ terminal coupled to the emitter of transistor Q9 and to current source 12. Current sources 12 and 14 act to pull a constant current through transistors Q9 and Q10 and resistors R3 and R4. Thus, as seen, a high $Data_{in}$ signal produces a high $Data_{out}$ signal and a low $\overline{Data}_{out}$ signal. It is easily seen that a high $\overline{Data}_{in}$ signal produces a low $Data_{out}$ signal and a high $\overline{Data}_{out}$ signal.

If clock signal CLK is at a high level and reset signal RST is driven high, transistor Q4 would be turned on even if $Data_{in}$ is high, since reset signal RST is higher than a high state $Data_{in}$ signal. Thus, all current would flow through transistor Q4, causing node 2 to be driven low and node 1 to be driven high, thus forcing $Data_{out}$ low and $\overline{Data}_{out}$ high.

When clock signal CLK goes low, the transistors comprising follow circuit 2 are disabled and have no effect on the levels at nodes 1 and 2. However, when clock signal CLK goes low, clock signal $\overline{CLK}$ goes high, turning on transistor Q5 and enabling hold circuit 3. The collector of transistor Q5 is coupled to a differential pair configuration comprising transistor Q6 and transistor Q7 and Q8 in parallel. The base of transistor Q6 is coupled to the $Data_{out}$ terminal through resistor R3, and the base of transistor Q7 is coupled to the $\overline{Data}_{out}$ terminal through resistor R4. Reset signal RST is coupled to the base of transistor Q8. Resistors R3 and R4 are to set the voltage levels at the bases of transistors Q6 and Q7 to approximately the levels at the bases of transistors Q6 and Q7 to approximately the levels of $Data_{in}$ and $\overline{Data}_{in}$ so that these levels will be compatible with the high $\overline{CLK}$ signal and the reset signal RST levels. Current sources 12 and 14 fix the voltage drop across resistors R3 and R4. The operation of hold circuit 3 is virtually identical to the operation of follow circuit 2 except that the inputs to transistors Q6 and Q7 now correspond to the states of $Data_{out}$ and $\overline{Data}_{out}$, respectively. Thus, when $Data_{out}$ is high during a high CLK signal, transistor Q6 will be turned on, driving node 1 low and holding transistor Q10 in the low state. Since transistor Q10 is in the low state, $\overline{Data}_{out}$ is driven low. And, since $\overline{Data}_{out}$ is low, transistor Q7, whose base is coupled to $\overline{Data}_{out}$ through resistor R4, is off allowing node 2 to be in the high state. A high node 2 keeps transistor Q9 in the high state which keeps $Data_{out}$ high. Hence, $Data_{out}$ and $\overline{Data}_{out}$ are held during the time $\overline{CLK}$ is high.

The high CLK voltage must be sufficiently below the low $Data_{in}$ voltage for transistor Q1 to have sufficient collector voltage to be biased into its active mode, and the high RST voltage must be sufficiently above the high $\overline{Data}_{in}$ voltage in order to prevent transistor Q2 from turning on when a high RST signal is applied to the base of transistor Q4. These voltage relationships are shown in FIG. 1b. As previously stated, the margin between the high RST voltage and the high $Data_{in}$ voltage uses up part of the already limited voltage range between zero volts and $+V_{cc}$ which could otherwise be used to increase the swing of Data$_{in}$ or reduce the required V$_{cc}$. Additionally, the reset circuitry of the latch of FIG. 1a requires a modification of the basic latch circuitry (i.e., adding transistors Q4 and Q8, and changing the level of Data$_{in}$ and the voltages at the bases of transistors Q7 and Q6). Further, various gate delays are incurred between the application of reset signal RST and the resetting of Data$_{out}$ and $\overline{\text{Data}}_{out}$.

In contrast to the circuit of FIG. 1a, FIG. 2a shows a prior art resettable latch circuit which uses single ended circuitry and whose reset signal does not limit the voltage swing of input data signal Data$_{in}$. The schematic of FIG. 2a is an actual schematic of the MECL III master-slave type D flip-flop (MC 1670) by Motorola. A master-slave flip-flop overcomes any unpredictable behavior of an edge triggered type flip-flop for slow-rising clock input pulses. In FIG. 2a, the master side of the master-slave flip-flop receives (follows) Data$_{in}$ on the trailing edge of clock pulse CLK and applies signals representing Data$_{out}$ and $\overline{\text{Data}}_{out}$, corresponding to the levels at node 4 and node 2, respectively, to the slave side. On the leading edge of the next clock pulse the master side holds Data$_{out}$ and $\overline{\text{Data}}_{out}$. The slave side follows the held data from the master side, i.e., Data$_{out}$ and $\overline{\text{Data}}_{out}$, on the same leading edge of clock pulse CLK but at a slightly delayed time and provides data signals to an output stage which, in turn, provides Data'$_{out}$ and $\overline{\text{Data}}'_{out}$ corresponding to Data$_{out}$ and $\overline{\text{Data}}_{out}$, respectively. The sleeve side then holds the data on the trailing edge of the clock pulse. FIG. 2b shows the various functions of the master and slave sides during a clock cycle.

The circuit of FIG. 2a uses differential logic similar to that used in FIG. 1a except that the voltages applied to the input terminals, such as Data$_{in}$, are applied to one transistor of the differential pair while the other transistor of the differential pair has applied to its control terminal a fixed reference voltage instead of, for example, $\overline{\text{Data}}_{in}$. This configuration requires the voltage swing of the Data$_{in}$ signal to be twice as great as the Data$_{in}$ signal in FIG. 1a in order to provide the same difference in voltage at the control terminals of the differential pair. Thus, generally speaking, the circuit of FIG. 2a will not function as well at lower V$_{cc}$'s, since the aggregate of the various larger voltage swings must fit into a restricted voltage range.

Detailed operation of the circuit of FIG. 2a is as follows. Assuming a high data signal Data$_{in}$ is applied to the Data$_{in}$ terminal and, hence, to the base of transistor 1Q4, and low clock signal CLK is applied to the CLK terminal, a low signal will thus be applied to the base of transistor 1Q2, and transistor 1Q3 will be turned on by reference voltage REF1, enabling the follow portion of the master side of the flip-flop. Because of the high Data$_{in}$ signal at the base of transistor 1Q4, the collector of transistor 1Q4, node 1, will be low and, since node 1 is coupled to the base of transistor 1Q11, the emitter of transistor 1Q11 will be low. Since the emitter of transistor 1Q11 is low, node 2, coupled to the emitter of transistor 1Q11 through resistor R2, will also be low. The signal at node 2 represents $\overline{\text{Data}}_{out}$ and is applied to the follow portion of the sleeve side of the flip-flop. The high Data$_{in}$ signal, being higher then REF2, makes transistor 1Q9 nonconductive and, hence, its collector, node 5, is at a high voltage. This high voltage is coupled to the base of transistor 1Q10 which conducts and pulls node 4, coupled to the emitter of transistor 1Q10 through resistor R3, up to a high level. The signal at node 4 represents Data$_{out}$ and is applied to the follow portion of the slave side of the flip-flop.

When CLK goes high, transistor 1Q2 turns on, since CLK is higher than REF1, and the levels on nodes 2 and 4 are held by transistors 1Q6 and 1Q7 having inputs into their bases of the voltages at nodes 4 and 5, respectively. Thus, the master side of the flip-flop follows Data$_{in}$ when clock signal CLK is low and holds Data$_{out}$ and $\overline{\text{Data}}_{out}$ when clock signal CLK goes high.

The slave side of the flip-flop receives the held output of the master side via transistors 2Q9 and 2Q4 when clock signal CLK is high and applies corresponding signals on nodes 5 and 6 to an output stage comprising transistors 2Q14 and 2Q15. The output stage provides level shifted signals Data'$_{out}$ and $\overline{\text{Data}}'_{out}$, corresponding to the signals on nodes 5 and 6, respectively. The data in the slave side is held by transistors 2Q7 and 2Q6 when CLK once again goes low. The master section then follows a new Data$_{in}$ bit applied to the Data$_{in}$ terminal.

The reset operation of the flip-flop of FIG. 2a differs from the operation of the reset FIG. 1a in a variety of ways. In the flip-flop of FIG. 2a, a high reset signal RST performs the same function as a high clock signal by turning on transistors 1Q2 and 2Q2. Thus, when reset signal RST is high, the functions of the master and slave sides of the flip-flop will operate as if clock signal CLK itself was high, i.e., the master holds and the slave follows. Additionally, reset signal RST is applied to the bases of transistors 1Q8 and 2Q8. Transistor 1Q8 forms part of the hold portion of the master side of the flip-flop and is in parallel with transistor 1Q7, transistor 1Q7 being the transistor which conducts during the hold function when $\overline{\text{Data}}_{out}$ is high and RST is low. Thus, when reset signal RST is high, enabling the hold portion of the master side by turning on transistor 1Q2, the high reset signal RST also turns on transistor 1Q8 which performs the same function as transistor 1Q7 when $\overline{\text{Data}}_{out}$ is high. The low voltage at the collector of transistor 1Q8 forces transistor 1Q10 to the low state and, hence, the emitter of transistor 1Q10, as well as node 4, are low. Since nodes 4 and 2 are at opposite states, the voltage at node 2 is high. Thus, a high signal is coupled to the base of transistor 2Q9 and a low signal is coupled to the base of transistor 2Q4 in the slave side of the flip-flop. Since the reset signal RST is high, transistor 2Q2 is on and current flows through transistor 2Q9. The low signal at the collector of transistor 2Q9 is applied to the base of output transistor 2Q14, forcing transistor 2Q14 to the low state and signalling a low Data'$_{out}$. Necessarily, the collector of transistor 2Q4 is now at a high state and forces transistor 2Q15 to the high state, signalling a high $\overline{\text{Data}}'_{out}$.

When reset signal RST is removed and clock signal CLK is low, normal operation of the master-slave flip-flop resumes. In the flip-flop of FIG. 2a, the level of reset signal RST need only be higher than the highest level of the voltages at the bases of transistors 1Q7 and 1Q6 in the master side of the flip-flop. Since the levels of the voltages applied to the bases of transistors 1Q6 and 1Q7 are generated within the flip-flop (e.g., by transistors 1Q10 and 1Q11 in conjunction with resistors R3 and R2, the reset level does not affect the level of Data$_{in}$ or the CLK level as it did in the circuit of FIG. 1a. In FIG. 2a, the reset level should be identical to the CLK level.

The circuit of FIG. 2a has overcome the problem regarding the extra level needed for a reset function, however, FIG. 2a only teaches how to solve this problem using circuits with single ended logic wherein one transistor of a differential pair is coupled to a fixed reference voltage (e.g., REF1, REF3). The disadvantage of single ended logic has been discussed previously. Another drawback with the reset operation in the circuit of FIG. 2a is the added gate delays incurred when a reset signal goes high, e.g., the delay through transistors 2Q8, 2Q10, 2Q6, and 2Q11. Further, three extra transistors, 1Q18, 1Q8, and 2Q8, are required to implement the reset function. It is therefore desirable to construct a circuit using differential logic wherein the level of the reset signal does not limit the range of the data input signal or the clock signal, wherein the reset function can be implemented into a latch circuit with a minimum number of additional components, and wherein the latch does not incur gate delay in its reset operation.

SUMMARY OF THE INVENTION

The present invention is a resettable latch circuit with improved reset operation, wherein the reset operates faster and does not require changing integral voltage levels to accommodate the reset signal. Additionally, the reset function may be added without modifying the basic latch and does not require additional transistors. In one embodiment of the invention a current source is coupled to the common sources of a differential pair of transistors, wherein an enable signal is coupled to the control terminal of a first transistor of the differential pair which when conducting enables the follow portion of the latch circuit. A second transistor of the differential pair, which when conducting enables the hold portion of the latch, has a first reference voltage REF1 coupled to its control terminal (either a reference voltage or an enabling signal may be used.) When an enable signal is present, current flows through the first transistor and through a differential pair of transistors, forming the follow portion, comprising a third and fourth transistor. The control terminal of the third transistor is coupled to an input data signal $Data_{in}$ and the control terminal of the fourth transistor is coupled to a second reference voltage REF2. Thus, when $Data_{in}$ and the enable signal are high, current flows through the third transistor. Conversely, if $Data_{in}$ is low, current flows through the fourth transistor. The drains of the third and fourth transistors are coupled to reset and $\overline{reset}$ signals RST and $\overline{RST}$, respectively, through first and second diodes, and each drain is also coupled to supply voltage $V_{cc}$ through a separate resistor so that when RST is high and $\overline{RST}$ is low the drain of the third transistor is immediately driven high and the drain of the fourth transistor is immediately driven low. The drain of the third transistor is also directly coupled to a first data output terminal $\overline{Data_{out}}$, and the drain of the fourth transistor is directly coupled to a second data output terminal $Data_{out}$. The effect of this configuration is that there are no intervening gates between the RST and $\overline{RST}$ signals and the output terminals to delay a high RST and low $\overline{RST}$ signal from driving $\overline{Data_{out}}$ high and $Data_{out}$ low.

The hold portion of the latch circuit is enabled by the second transistor when enable signal is low. The second transistor has its drain coupled to a differential pair of transistors, forming the hold portion, comprising fifth and sixth transistors, wherein the control terminal of the fifth transistor is coupled to output terminal $Data_{out}$ while its drain is coupled to output terminal $\overline{Data_{out}}$. The control terminal of the sixth transistor is coupled to $\overline{Data_{out}}$ while its drain is coupled to $Data_{out}$. Thus, the fifth and sixth transistors hold the state of $\overline{Data_{out}}$ and $Data_{out}$ when the enable signal is low. When the RST and $\overline{RST}$ signals are applied, via the first and second diodes, to the output terminals and removed while the enable signal is low, $\overline{Data_{out}}$ and $Data_{out}$ will be held at their reset levels until the enable signal goes high.

As seen, the above-described configuration allows a reset function to be added to a latch without modifying the basic latch, and only two additional diodes are required to couple the reset signals to the latch. Additionally, the output of the latch immediately responds to a reset signal without any intervening gate delay. Also, the reset signal does not require adding any new internal voltage levels for switching transistors. Further, since the reset signals are directly connected to the output terminals and the hold portion of the latch, a narrower reset pulse width may be used to set the latch. Also, faster reset recovery exists by not having an intervening gate delay between the removal of the reset signal and the restoration of the non-reset $Data_{out}$ and the $\overline{Data_{out}}$ signals.

BRIEF DESCRIPTION OF THE DRAWINGS

FIG. 1b shows various voltage levels used in the circuit of FIG. 1a.

FIG. 2b shows the functions of the master and slave sections of the flip-flop of FIG. 2a during a clock cycle.

FIG. 3 illustrates one embodiment of the invention.

DETAILED DESCRIPTION

Figure 1A:
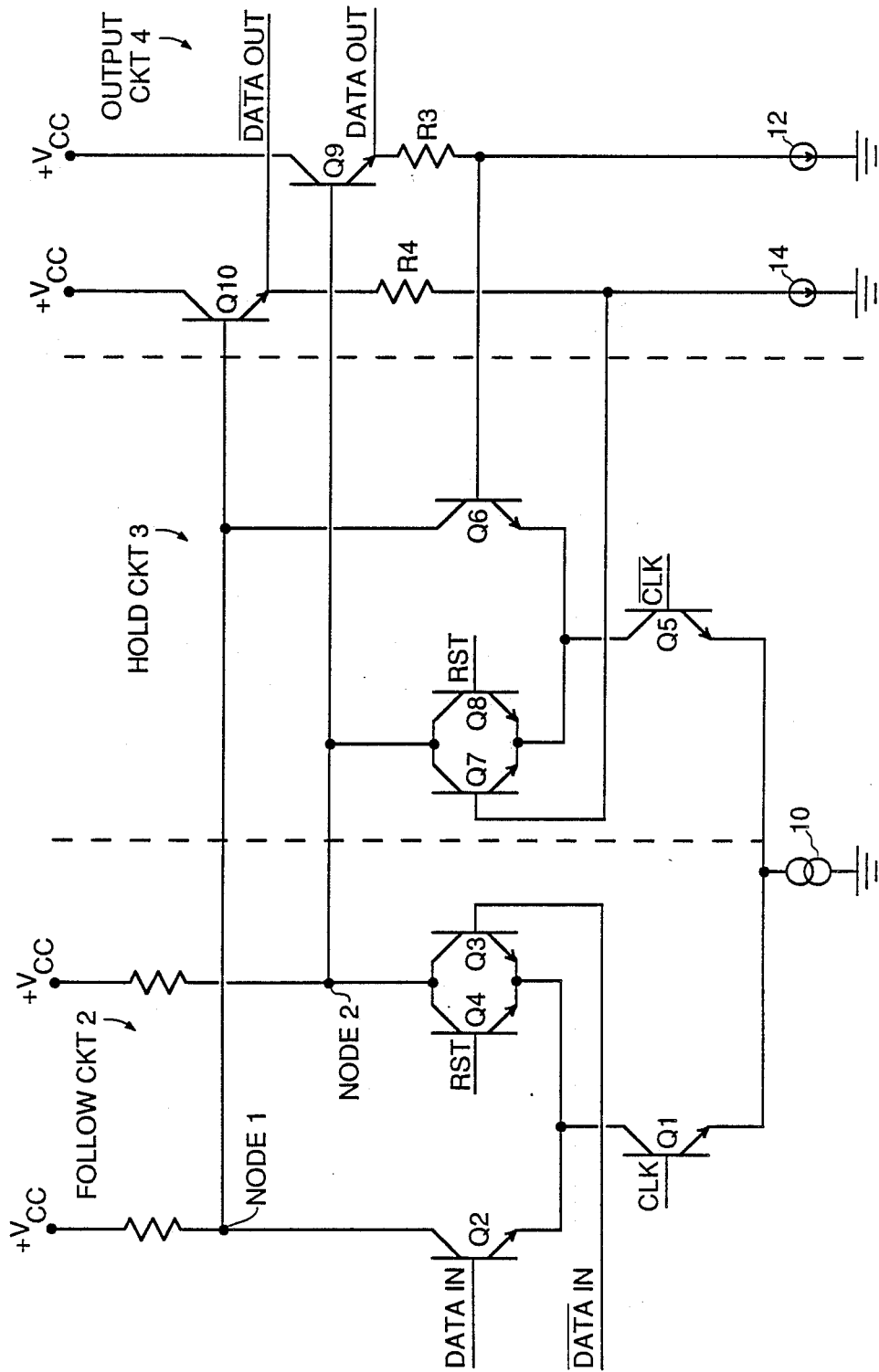
FIG. 1a shows a typical prior art latch using differential pair logic.
Figure 2A:
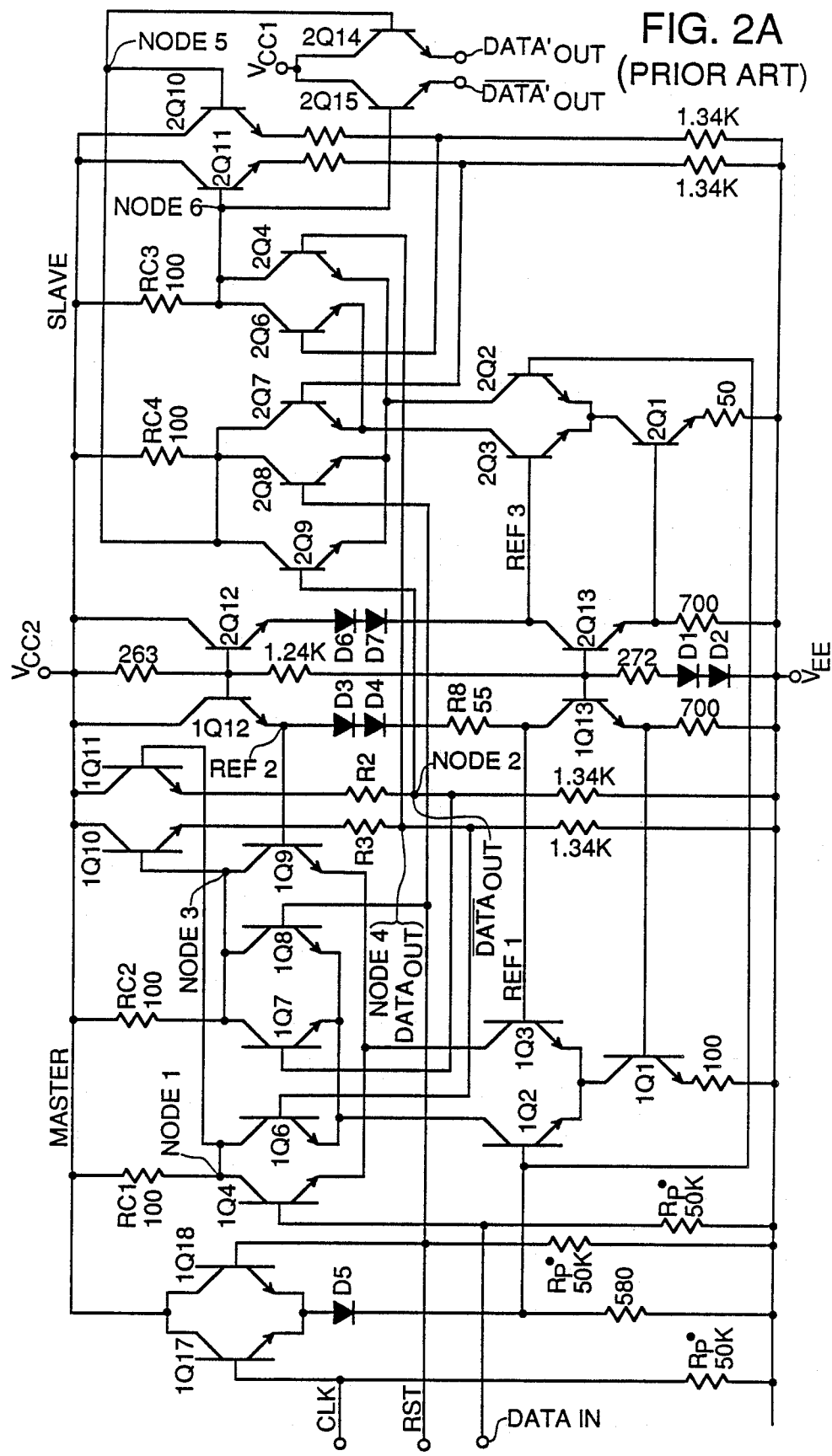
FIG. 2a shows a prior art master-slave D type flip-flop using single ended logic.

One embodiment of our invention resettable latch circuit which possesses the advantages mentioned previously is shown in FIG. 3. FIG. 3 shows a latch which, during a high enable signal G, provides a signal corresponding to the state of an incoming data signal $Data_{in}$ to output terminals $Data_{out}$ and $\overline{Data_{out}}$ and, during a low enable signal, holds the states of $Data_{out}$ and $\overline{Data_{out}}$. In the embodiment of FIG. 3, the transistors used are MESFETs using GaAs technology, however, bipolar, MOSFETs, or other types of transistors may be substituted. Also, in the circuit of FIG. 3 the various fixed reference voltages shown applied to one transistor of a differential pair may be substituted by a dynamic signal which is an inverse of the signal applied to the other transistor of the differential pair.

In the circuit of FIG. 3, a fixed current source 10 is provided, with one end of current source 10 coupled to ground and its other end coupled to the common sources of transistors Q1 and Q2 forming a differential pair. The gate of transistor Q1 is coupled to receive enable signal G, which may be a clock signal, so that when enable signal G is high, Q1 becomes conductive and enables follow portion 12 of the latch circuit. Reference voltage REF1 is coupled to the gate of transistor Q2, wherein reference voltage REF1 is approximately midway between the high and low states of enable signal G so that when enable signal G is high, transistor Q2 is off, and when enable signal G is low, transistor Q2 is on, enabling hold portion 14 of the latch circuit. The drain of transistor Q1 is coupled to the common sources of transistors Q3 and Q4, forming a differential pair, with the gate of transistor Q3 coupled to receive incoming data signal $Data_{in}$. The gate of transistor Q4 is coupled to reference voltage REF2, REF2 being of an amplitude approximately midway between the high and low states of $Data_{in}$ so that when $Data_{in}$ is high, transistor Q4 is turned off and transistor Q3 is turned on. Conversely, when $Data_{in}$ is low, transistor Q4 is turned on and transistor Q3 is turned off. The drain of transistor Q3 (node 1) is coupled to supply voltage $+V_{cc}$ through resistor R1 and is directly coupled to output terminal $\overline{Data}_{out}$. The drain of transistor Q4 (node 2) is coupled to $+V_{cc}$ through resistor R2 and is directly coupled to output terminal $Data_{out}$. The above described portion of the latch circuit operates such that when both $Data_{in}$ and enable signal G are high, current flows through resistor R1 through transistors Q3 and Q1 to ground, pulling down node 1, and hence $\overline{Data}_{out}$, to a low voltage. Since transistor Q4 is now nonconductive, a high voltage is seen at the drain of transistor Q4, or node 2, and, hence, $Data_{out}$ is at a high voltage, signifying that $Data_{in}$ is high. When enable signal G goes low, both transistors Q3 and Q4 are made nonconductive, and the levels at output terminals $Data_{out}$ and $\overline{Data}_{out}$ are determined by the hold portion of the latch, which is described below.

The drain of transistor Q2 is coupled to a differential pair comprising transistors Q5 and Q6, wherein transistor Q5 has its gate coupled directly to output terminal $Data_{out}$ and its drain (node 1) coupled directly to output terminal $\overline{Data}_{out}$. The gate of transistor Q6 is coupled directly to output terminal $\overline{Data}_{out}$, with drain of transistor Q6 (node 2) coupled directly to output terminal $Data_{out}$. The function of transistors Q5 and Q6 is to latch the output states at existing levels of $\overline{Data}_{out}$ and $Data_{out}$ over the period where enable signal G is lower than REF1 so that data is not lost between high enable, or clock, signals.

The inventive reset portion of the latch of FIG. 3 operates as follows. Reset signals RST and $\overline{RST}$ signal are applied to diodes D1 and D2, respectively, so that diodes D1 and D2 become forward biased upon application of the RST and $\overline{RST}$ signals. Diodes D1 and D2 may be any non-linear device which functions similarly. The cathode of diode D1 is coupled directly to output terminal $\overline{Data}_{out}$, while the anode of diode D2 is coupled directly to output terminal $Data_{out}$, so that upon application of a high RST and a low $\overline{RST}$, $Data_{out}$ will immediately be pulled up to a high level and $\overline{Data}_{out}$ will immediately be pulled down to a low level. The $\overline{RST}$ signal and diode D2 may be eliminated and the latch of FIG. 3 will still reset; however, the latch will only have one valid output, namely $\overline{Data}_{out}$. Similarly, RST can be eliminated but only $Data_{out}$ will be a valid output.

As seen from FIG. 3, our inventive reset circuitry may be added to a basic latch without modifying the latch. Other advantages of this reset circuitry have been delineated previously.

This concept of applying a reset signal to directly set a logic state at an output terminal may be applied to a variety of latch circuits which will be apparent to those of ordinary skill in the art.

Figure 4:
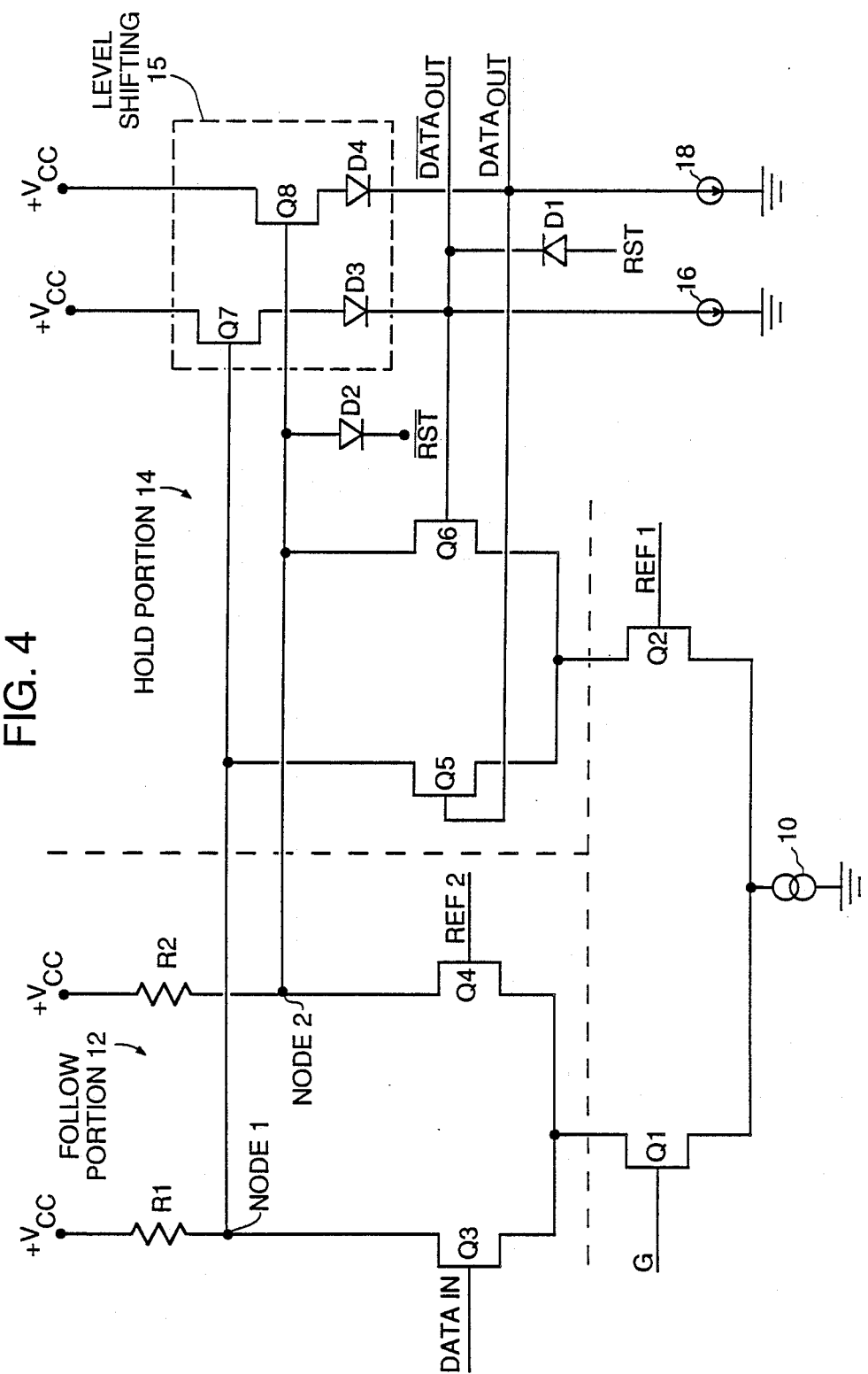
FIG. 4 illustrates an alternative embodiment of the invention.

FIG. 4 shows a latch circuit similar to that of FIG. 3 but includes level shifting circuitry 15 to achieve a desired level at output terminals $Data_{out}$ and $\overline{Data}_{out}$. In the circuit of FIG. 4, the transistors with the same nomenclatures as in FIG. 3 operate and are configured identically as in FIG. 3. In FIG. 4, the common drains of transistors Q3 (node 1) and Q5 are coupled to the gate of level shifting transistor Q7, whose drain is coupled to supply voltage $+V_{cc}$ and whose source is coupled to ground via diode D3 and current source 16. Diode D3 is used to provide a voltage drop; other devices, such as a resistor, may be substitute to perform the same function. Output terminal $\overline{Data}_{out}$ is coupled between diode D3 and current source 16 so that when node 1 is high, a high signal will be applied to the gate of transistor Q7, and $\overline{Data}_{out}$ will be driven high.

The common drains of transistors Q4 (node 2) and Q6 are coupled to the gate of level shifting transistor Q8 whose drain is coupled to $+V_{cc}$ and whose source is coupled to ground through diode D4 and current source 18. Diode D4 performs a similar function as diode D3 and may be replaced by a resistor. Output terminal $Data_{out}$ is coupled between diode D4 and current source 18 so that when node 2 is low, a low signal will be applied to the gate of transistor Q8, and $Data_{out}$ will be driven low. The configuration of transistors Q5 and Q6 ensure $Data_{out}$ and $\overline{Data}_{out}$ are at opposite states when enable signal G becomes low.

The reset operation in the latch of FIG. 4 is as follows. Reset signal RST is coupled, via diode D1, to output terminal $\overline{Data}_{out}$, as in FIG. 3, to immediately set the state of $\overline{Data}_{out}$ to high upon application of a high RST. Reset signal $\overline{RST}$ is coupled, via diode D2, to the gate of transistor Q8 so that when RST goes high and $\overline{RST}$ goes low, $\overline{Data}_{out}$ goes high and $Data_{out}$ goes low since transistor Q8 is now in the low state. It is to be noted that this circuit could be operated without $\overline{RST}$; however, without RST, only the state of $\overline{Data}_{out}$ would be valid. Similarly, if RST were eliminated only the state of $\overline{Data}_{out}$ would be valid since $\overline{RST}$ would force $Data_{out}$ to a low state.

Figure 5A:
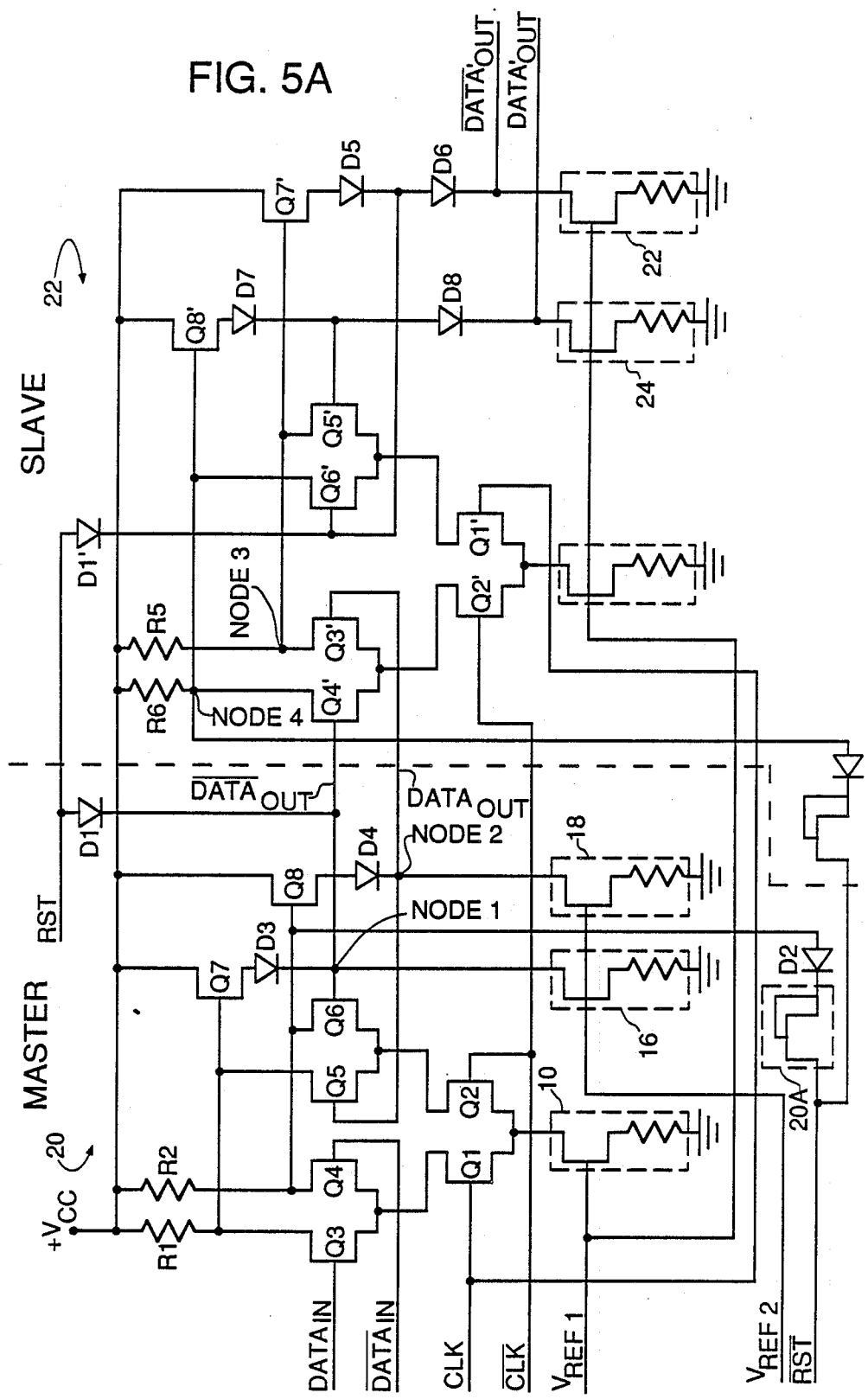
FIG. 5a illustrates a detailed circuit diagram of another embodiment of the invention which forms a master-slave type latch.

FIG. 5a shows a master-slave flip-flop using our inventive reset circuit, wherein master side 20 of the flip-flop performs the identical function as the circuit of FIG. 4, and all elements in FIG. 5a with nomenclatures identical to that in FIG. 4 perform the same function as those in FIG. 4. Inverse signals $\overline{Data}_{in}$ and $\overline{CLK}$ replace REF2 and REF1 in FIG. 4, respectively. Additional components shown in FIG. 5a include MESFET's and resistors forming current sources 10, 16 and 18 and level shifter 20A, which level shifts the $\overline{RST}$ signal for application to the gate of level shifting transistor Q8. Diodes D3 and D4 provide level shifting, and signals $V_{ref1}$ and $V_{ref2}$ control current through current sources 10, and 16 and 18.

Slave side 22 is very similar to master side 20 except that in slave side 22, enable transistor Q1' enables the hold portion of slave side 22 when clock signal CLK goes high, while enable transistor Q1 enables the follow portion of master side 20 when CLK goes high. Conversely, transistor Q2' enables the follow portion of slave side 22 when $\overline{CLK}$ is high, while transistor Q2 enables the hold portion of master side 20 when $\overline{CLK}$ is high. The concept of the master-slave flip-flop of FIG. 5a is that master side 20 produces intermediate output signals $Data_{out}$ and $\overline{Data}_{out}$ on nodes 2 and 1, respectively, for application to slave side 22 on the leading edge of clock signal CLK, and slave side 22 provides output signals to terminals Data'$_{out}$ and $\overline{\text{Data'}}_{out}$ on the trailing edge of clock signal CLK. Further, master side 20 latches Data$_{out}$ and $\overline{\text{Data}}_{out}$ on the trailing edge of clock signal CLK, and slave section 22 latches Data'$_{out}$ and $\overline{\text{Data'}}_{out}$ on the leading edge of the next CLK signal. Thus, data is transferred from the input of the flip-flop to the output of the flip-flop during one clock pulse period.

The operator of slave side 22 is as follows. Master side 20 provides signals $\overline{\text{Data}}_{out}$ and Data$_{out}$ to transistors Q4' and Q3' configured as a differential pair. As previously mentioned, when CLK goes low and $\overline{\text{CLK}}$ goes high, slave side 22 provides output signals to terminals $\overline{\text{Data'}}_{out}$ and Data'$_{out}$ corresponding to signals $\overline{\text{Data}}_{out}$ and Data$_{out}$. Assuming Data$_{out}$ and $\overline{\text{CLK}}$ are both at a high level, transistor Q3' is turned on by the high Data$_{out}$ signal and the drain of transistor Q3' (node 3), coupled to V$_{cc}$ via resistor R5, is pulled down to a low voltage. Transistor Q4' is cut off due to $\overline{\text{Data}}_{out}$ being low and, hence, the drain (node 4) of transistor Q4', being coupled to V$_{cc}$ via resistor R6, is at a high voltage. The gate of level shifting transistor Q7' is coupled to node 3, with the drain of transistor Q7' coupled to +V$_{cc}$ and its source coupled to ground via diodes D5 and D6 and current source 22. Hence, transistor Q7' is at a low state, and output terminal $\overline{\text{Data'}}_{out}$, coupled to the cathode of diode D6, is pulled to a low level. Diodes D5 and D6 act to shift the voltage level at $\overline{\text{Data'}}_{out}$. The high node 4, coupled to the gate of level shifting transistor Q8', drives transistor Q8' to a high state, and, hence, a high voltage is coupled to output terminal Data'$_{out}$ via diodes D7 and D8, diodes D7 and D8 providing level shifting. Current sources 22 and 24 provide a constant current through transistors Q7' and Q8' respectively. Thus, the level at Data'$_{out}$ follows the state of Data$_{out}$ on the trailing edge of clock signal CLK.

Figure 5B:
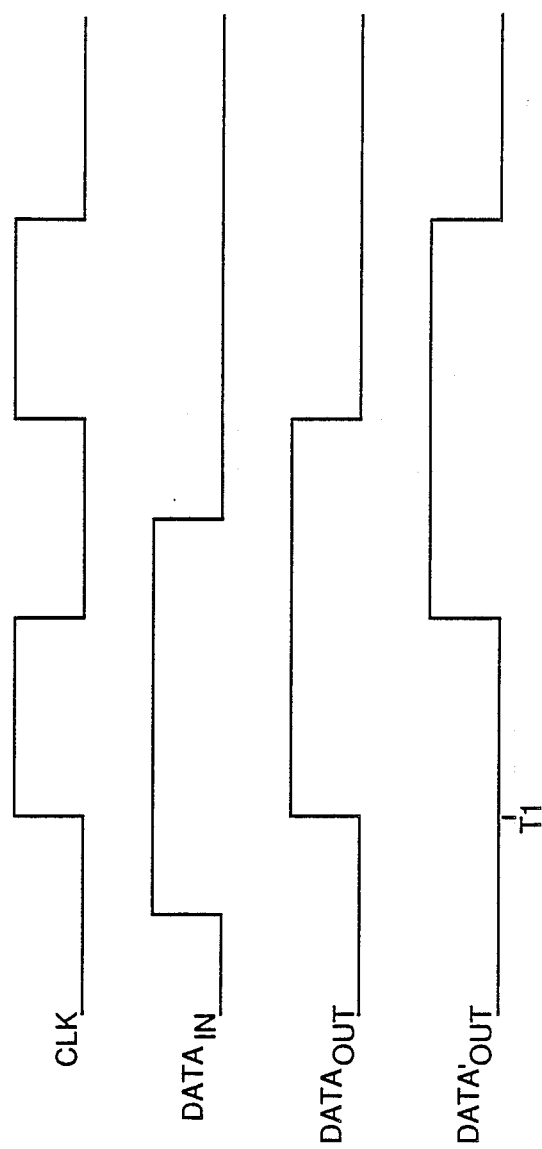
FIG. 5b shows various voltage levels in the circuit of FIG. 5a over a clock cycle.

The hold portion of slave side 22 comprises transistors Q6' and Q5' in a differential pair configuration whose common sources are coupled to transistor Q1'. The gate of transistor Q1' is coupled to clock signal CLK so that when clock signal CLK goes high, transistors Q6' and Q5' hold the levels of $\overline{\text{Data'}}_{out}$ and Data'$_{out}$, similar to the function of transistors Q6 and Q5 in master side 20. FIG. 5b illustrates the levels of the outputs of master side 20 and slave side 22 given that Data$_{in}$ has gone from a low state to a high state just before clock signal CLK goes high at time T1.

The reset circuit incorporated into FIG. 5a operates on slave side 22 as follows. Reset signal RST is applied, via diodes D1 and D1', to the gates of transistors Q4' and Q6', forcing node 4 to a low state, and also applied between diodes D5 and D6 to immediately force $\overline{\text{Data'}}_{out}$ to go high without any intervening gate delay. Thus, whether CLK is at a high or low level, a high reset signal forces $\overline{\text{Data'}}_{out}$ to a high level. A level shifted inverted reset signal RST is coupled to the gate of transistor Q8' so that when $\overline{\text{RST}}$ is low, the gate of transistor Q8' is immediately pulled low by action of $\overline{\text{RST}}$ and, thus, output terminal Data'$_{out}$ is pulled low.

As seen in the operation of the reset circuitry in FIGS. 3-5, the reset signals are coupled to immediately force the outputs to their respective reset states without any intervening gate delay. Additionally, as previously mentioned, the levels of the clock and the data signals need not be modified to accommodate a reset level. Additionally, this reset circuitry may be simply coupled to an existing latch without modifying the latch. Other benefits of our inventive circuit have been delineated previously.

The circuit described with respect to FIGS. 3-5 may be implemented using bipolar or field effect transistors and, additionally, may be implemented using compound semiconductor technology, such as gallium arsenide technology.

The present invention has been described with reference to the various embodiments thereof, however, the invention is not intended to be limited to the herein described embodiments. Various modifications in form and structure will be obvious to those skilled in the art while keeping with the spirit and scope of the invention.

We claim:

1. A reset circuit incorporated into a latch circuit, said latch circuit being of the type which receives a first input data signal and generates a first output signal at a first output terminal, after latching, in response to said first input data signal, said reset circuit operating to set said first output signal at a predetermined high or low state upon application of a first reset signal to said reset circuit, said reset circuit comprising:

a first two terminal nonlinear device with a first terminal coupled to receive said first reset signal and a second terminal coupled to said first output terminal of said latch circuit, whereby, upon application of said first reset signal to said first terminal of said first nonlinear device, said first output terminal will assume the state of said first reset signal prior to said latch circuit latching, wherein said latch circuit generates a second output signal of a state opposite to that of said first output signal for application to a second output terminal, and wherein a second reset signal of opposite state as said first reset signal is applied to a first terminal of a second two terminal nonlinear device wherein a second terminal is coupled to said second output terminal, so that upon application of said second reset signal to said first terminal of said second nonlinear device, said second output terminal will assume the state of said second reset signal, wherein said latch circuit incorporates a hold circuit comprising a first differential transistor pair being enabled by an enable signal, said first differential transistor pair comprising a first transistor and a second transistor, said first transistor having a control terminal coupled to said second output terminal and a second terminal coupled to said first output terminal, said second transistor having a control terminal coupled to said first output terminal and a second terminal coupled to said second output terminal, said first transistor and said second transistor having third terminals being coupled together and connected to an enable circuit, said enable circuit, upon application of a first state of said enable signal to said enable circuit, causing a current to be drawn through said first differential pair, and wherein said second reset signal, through said second nonlinear device, and said second terminal of said second transistor are coupled to said second output terminal via a first level shifting means so that when said second terminal of said second transistor is at a high level, said level shifting means will apply a high signal to said second output terminal, and when said second reset signal is at a low level a low signal will be applied to said second output terminal.

2. The reset circuit of claim 1 wherein said second terminal of said first transistor is coupled to said first output terminal via a second level shifting means.

3. The reset circuit of claim 2 wherein said latch circuit also incorporates a follow circuit comprising a second differential transistor pair, said second differential transistor pair comprising a third transistor and a fourth transistor, said third transistor having a control terminal coupled to receive said first input data signal and a second terminal coupled to said second terminal of said first transistor in said hold circuit, said fourth transistor having a control terminal coupled to receive a second input signal and a second terminal coupled to said second terminal of said second transistor in said hold circuit, said third transistor and said fourth transistor having third terminals being coupled together and connected to said enable circuit, said enable circuit, upon application of a second state of said enable signal to said enable circuit, causing a current to be drawn through said second differential pair, said follow circuit and said hold circuit being alternatively enable by said enable signal.

4. The reset circuit of claim 3 wherein said second input signal is a fixed reference voltage.

5. The reset circuit of claim 3 wherein said second input signal is an inverse of said first input data signal.

6. The reset circuit of claim 3 wherein said enable circuit comprises a fifth and sixth transistor in a third differential transistor pair, wherein said enable signal is applied to a control terminal of said fifth transistor and a second terminal of said fifth transistor is coupled to said third terminals of said third and fourth transistors in said follow circuit, and wherein a reference signal is applied to a control terminal of said sixth transistor and a second terminal of said sixth transistor is coupled to said third terminals of said first and second transistors in said hold circuit, said follow circuit and said hold circuit being alternatively enabled by said enable signal as determined by whether or not the magnitude of said enable signal exceeds the magnitude of said reference signal.

7. The reset circuit of claim 1, 2, 3, 4, 5, or 6 wherein said first and second transistors are bipolar transistors.

8. The reset circuit of claim 1, 2, 3, 4, 5, or 6 wherein said first and second transistors are field-effect transistors.

9. The reset circuit of claim 1, 2, 3, 4, 5, or 6 wherein said first and second transistors are compound semiconductor transistors.

10. The reset circuit of claim 1, 2, 3, 4, 5, or 6 wherein said first and second transistors are gallium arsenide (GaAs) transistors.

11. The reset circuit of claim 1, 5, 6, 7, 8, or 9 wherein said first and second transistors are gallium arsenide (GaAs) field-effect transistors.

12. The reset circuit of claim 1, 2, 3, 4, 5, or 6 wherein said first and second transistors are gallium arsenide (GaAs) bipolar transistors.

* * * * *

UNITED STATES PATENT AND TRADEMARK OFFICE
CERTIFICATE OF CORRECTION

PATENT NO.    : 4,970,406
DATED         : November 13, 1990
INVENTOR(S)   : Fitzpatrick, et al.

It is certified that error appears in the above-identified patent and that said Letters Patent is hereby corrected as shown below:

Col. 2, line 62, "$\overline{Data}_{in}$" should read --$Data_{in}$--.

Col. 3, lines 29 and 62, "sleeve" should read --slave--.

Col. 12, line 8, delete "alternatively" and insert --alternately--.

Col. 12, line 24, delete "5, 6, 7, 8, or 9" and insert --2, 3, 4, 5, or 6--.

Signed and Sealed this

Second Day of March, 1993

Attest:

STEPHEN G. KUNIN

*Attesting Officer*  Acting Commissioner of Patents and Trademarks